United States Patent
Menon

(10) Patent No.: US 7,255,259 B2
(45) Date of Patent: Aug. 14, 2007

(54) OPERATOR-SERVICEABLE WIRE FEED SENSOR GUIDE FOR USE IN SEMICONDUCTOR PACKAGE FABRICATION

(75) Inventor: Radhakrishnan Menon, Selangor Darul Ehsan (MY)

(73) Assignee: Texas Instruments Incorporated, Dallas, TX (US)

( * ) Notice: Subject to any disclaimer, the term of this patent is extended or adjusted under 35 U.S.C. 154(b) by 319 days.

(21) Appl. No.: 10/933,964

(22) Filed: Sep. 4, 2004

(65) Prior Publication Data

US 2006/0049233 A1    Mar. 9, 2006

(51) Int. Cl.
*B23K 31/02* (2006.01)
(52) U.S. Cl. .................................. 228/8; 228/47.1
(58) Field of Classification Search ............ 228/8, 228/47.1
See application file for complete search history.

(56) References Cited

U.S. PATENT DOCUMENTS 4,506,818 A * 3/1985 Ritter et al. ................. 227/67
5,975,403 A * 11/1999 Ueda et al. ..................... 228/8
6,012,664 A * 1/2000 Duclos et al. ............... 242/131

FOREIGN PATENT DOCUMENTS

| JP | 58202969 A | * | 11/1983 |
| JP | 02106226 A | * | 4/1990 |
| JP | 02137343 A | * | 5/1990 |

* cited by examiner

*Primary Examiner*—Jonathan Johnson
(74) *Attorney, Agent, or Firm*—Yingsheng Tung; Wade James Brady, III; Frederick J. Telecky, Jr.

(57) ABSTRACT

A wire feed sensor guide, used in fabrication of semiconductor packages, guides a wire W from a wire source to a wire bonding location. The wire feed sensor guide has a unitary slider 1 that can be manually slid into and out of a fixed portion (2 or 2/3). Slider 1 has a slot SL that guides wire W, and includes a hole S for a sensor wire SW (such as optical fiber) that senses the position of wire W within the slot. Slider 1 also includes an air tube hole A that transmits air to urge wire W from a first position W1 toward a second position W2 during a wire bonding cycle. Advantageously, the unitary nature of the slider (including its air tube hole A and sensor wire hole S) ensure that the air blowing and wire position sensing processes do not require manual adjustment. Moreover, the end of the sensor wire is substantially protected from contamination by being substantially enclosed in the slider 1 and exposed only inside slot SL, thus increasing reliability. Further, the insertion and extraction of slider 1 may be performed without tools by an individual having no specialized training or skills, thus avoiding damage to or loss of parts that occurs in conventional arrangements.

12 Claims, 2 Drawing Sheets

OPERATOR-SERVICEABLE WIRE FEED SENSOR GUIDE FOR USE IN SEMICONDUCTOR PACKAGE FABRICATION

BACKGROUND

1. Field of the Invention

The invention relates to wire feed sensor guides used in semiconductor package fabrication. More specifically, the invention relates to wire feed sensor guides that are of a simple (for example, unitary) construction, and thus are easily replaceable and serviceable by operators or technically unskilled individuals.

2. Related Art

Wire feed sensor guides are known in the art of semiconductor package fabrication. Such guides feed wire to a capillary in order to bond lengths of the wire between points in a semiconductor package. Semiconductor package fabrication systems typically include a motor to which a spool of the wire is attached, an eyelet through which the wire passes before entering the sensor guide, an air tensioner for controlling an amount of tension present in the wire extending from the spool to a wire clamp that is disposed between the tensioner and the capillary.

One conventional wire feed sensor guide includes a wire sensor, an air pressure inlet, and two guide plates separated by a shim plate. The sensor is adjusted to be aligned with a path of the wire, and is locked in place. The guide plates guide the wire so that the wire can be controlled to be within sensor range, the wire location being controlled in part by air pressure from the air pressure inlet.

This conventional wire feed sensor guide arrangement has several disadvantages. To remove the assembly for cleaning or other maintenance, two tiny screws have to be removed and the assembly has to be taken apart in three pieces (the two closely-spaced guide plates and shim). Removing the screws releases all three pieces simultaneously, which often causes damage or loss.

The pieces are difficult to replace properly and adjust accurately. After being repaired or cleaned, the parts cannot readily be easily re-assembled and reliably set in their original positions, especially by those individuals not having specialized training and skills. Improper re-assembly causes such issues as the wire becoming kinked or stuck, or simply fluttering rather than being smoothly fed along a desired path.

Moreover, in this conventional arrangement, the wire sensor is exposed to dust and other elements, the wire position sensing thus becoming less reliable and causing the overall wire bonding operation to be sluggish. Given the structure of the conventional wire feed sensor guide, in which the sensor is difficult to remove and clean, the susceptibility of the wire sensor to contamination adds to the problems described above.

The frequency of defects and stoppages caused by this conventional wire feed sensor guide is very high. Moreover, maintenance often causes damage to the assembly, which in turn causing deterioration in MTBA (mean time between assists; a reliability measure based on an average time between assists required to maintain equipment). In any event, most operators cannot safely perform simple maintenance, and have to depend on technicians or other individuals having specialized skill and training.

SUMMARY

The present inventor has recognized a need to provide a wire feed sensor guide arrangement that is inherently more reliable and more easily maintained by individuals with minimal specialized skill and training.

The invention provides a wire feed sensor guide especially suitable for use in fabrication of semiconductor packages, by controllably guiding a wire from a wire source to a wire bonding location. The wire feed sensor guide has a unitary piece configured to be manually removable without tools from a fixed portion by individuals without specialized skill or training, thus simplifying any maintenance that is needed.

The unitary piece includes a slot configured to guide the wire from the wire source to the wire bonding location. In one embodiment of the unitary piece, holes (such as those used to supply air to blow against the wire in the slot, or to fix a location a wire position sensor) are provided at fixed locations with respect to the slot, so as to avoid the need to manually adjust the air tube or sensor wire, thus reducing the need for maintenance.

Other features and advantages are apparent from a reading of the following disclosure.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which:

FIG. 2A is a perspective, partial cutaway view thereof;

FIG. 2B is an end view thereof; and

FIG. 2C is a side view thereof, it being understood that the opposite side view may be a mirror image of that shown in FIG. 2C.

DETAILED DESCRIPTION

Figure 1:
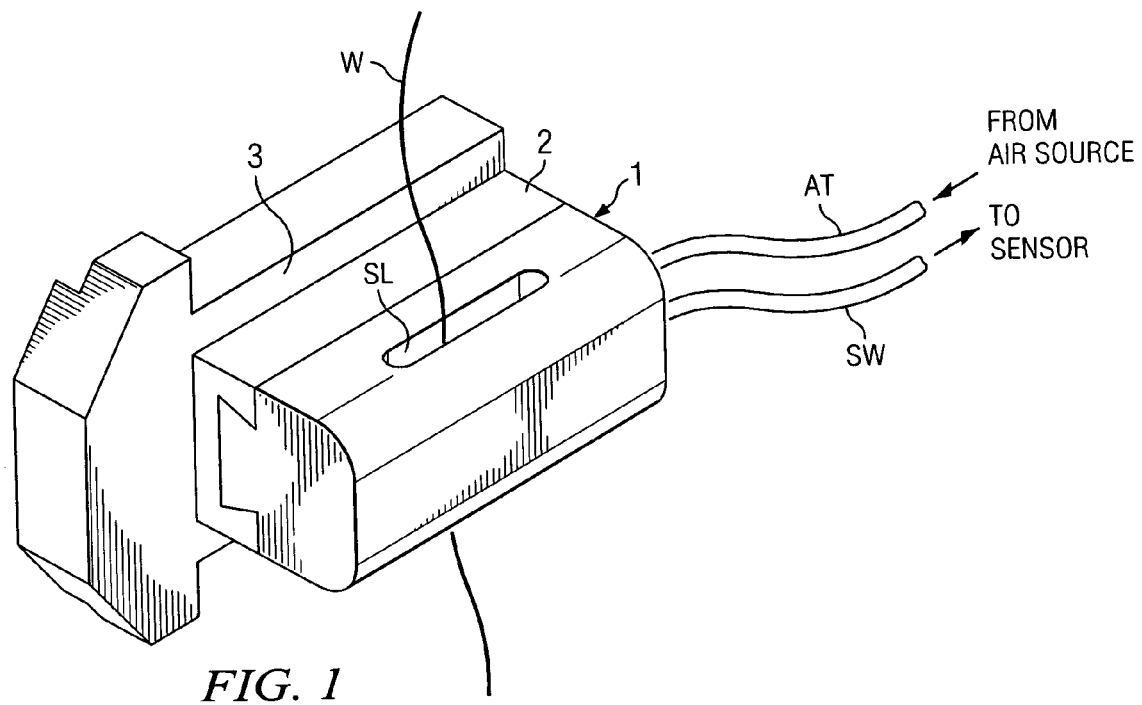
FIG. 1 is a perspective view of a wire feed sensor guide according to one embodiment, including a slider 1, a fixed portion 2, and a base 3 that may be integral with fixed portion 2.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design, selection, and implementation of basic electronic and mechanical elements and fabrication steps, lies within the ability of those skilled in the art, and accordingly any detailed discussion thereof may be omitted.

Referring now to the drawings FIG. 1 is a perspective view of a wire feed sensor guide according to one embodiment. The illustrate wire feed sensor guide includes a slider 1, a fixed portion 2, and a base 3. Fixed portion 2 and base 3 may be a unitary (single) component, the single component being considered a fixed portion 2/3 as distinguished from slider 1.

Slider 1 includes a slot SL through which a wire W extends. In a semiconductor package fabrication apparatus, wire W extends from a spool or other wire supply source to a capillary or bonding location at which lengths of the wire may be affixed to connect portions of the semiconductor package. An air tube AT and a sensor wire SW are connected to slider 1. An air source (not illustrated) is connected to the opposite end of air tube AT, and provides air to the slider as described below. A sensor (not illustrated) is connected to the opposite end of sensor wire SW, and senses the position of wire W within slot SL. In one embodiment, sensor wire SW is an optical fiber and the sensor is an optical sensor.

Figure 2A:
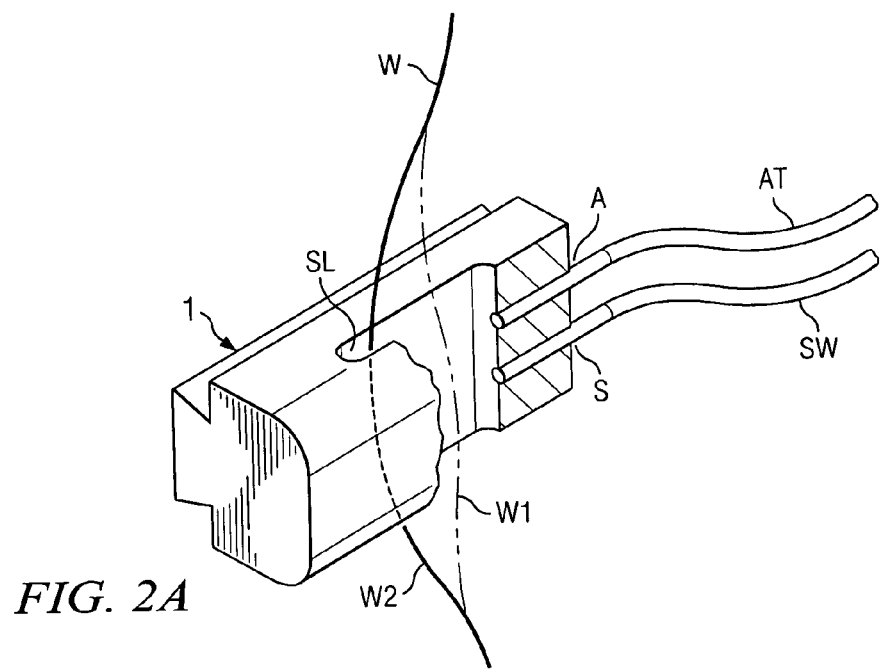
FIGS. 2A, 2B and 2C illustrate views of slider 1 (FIG. 1), in particular.
Figure 2B:
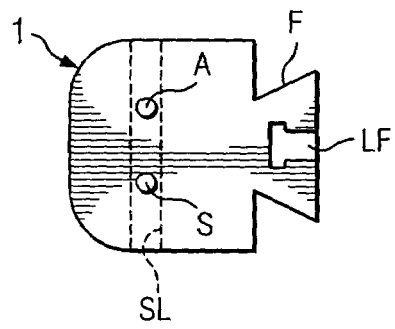
Figure 2C:
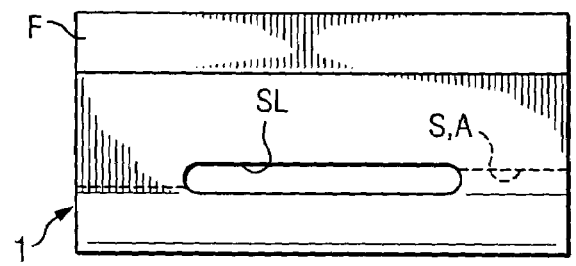

FIGS. 2A, 2B, and 2C illustrate various views of the slider 1 (FIG. 1). In particular: FIG. 2A is a perspective, partial cutaway view thereof; FIG. 2B is an end view thereof; and FIG. 2C is a side view thereof.

Referring especially to FIG. 2A, the air tube AT is shown connected to an air tube hole A in the end of slider 1. Further, the switch wire SW is shown connected to a switch wire hole S, also in the end of slider 1 Air tube hole A and switch wire hole S extend from the end of the slider to an end of a slot SL. In one embodiment, slot SL is a long, thin slot that is disposed longitudinally in the slider. Air tube hole A and switch wire hole S may be substantially parallel and may extend to the same end of slot SL.

Wire W may be in two extreme positions W1 and W2 in slot SL, as well as any position between W1 and W2. The wire is in position W1 when the wire tension is high and/or when air from the air source (not pictured) is not adequately forcing the wire toward position W2. The wire is in position W2 when the wire tension is low so that air from the air source (not pictured) exerts a displacing force on the wire away from position W1.

Referring now to the end view of FIG. 2B, the slider is shown to include a main slider portion including sensor wire hole S and air tube hole A, extending to slot SL (shown in dotted lines). Connected to the main slider portion is a foot F that may be regular-trapezoidal in cross section. On end of the foot F may include a latch female portion LF that serves to latch the slider 1 in position in fixed portion 2 (see FIG. 3, discussed below).

Referring now to the side view of FIG. 2C, one embodiment of slot SL is shown as a long, thin slot that extends longitudinally in slider 1 and through it in a lateral direction. Air tube hole A and sensor wire hole S connect an end of the slot to the end of the slider. In this arrangement, the air from the air source (not shown) fed through air tube hole A to an end of the slot to exert force on wire W to urge it from position W1 toward position W2. Also, light from the slot may enter an optical fiber inserted in sensor wire hole S to reach a sensor (not shown) such as an optical sensor that can thus detect the location of wire W within slot SL.

Figure 3:
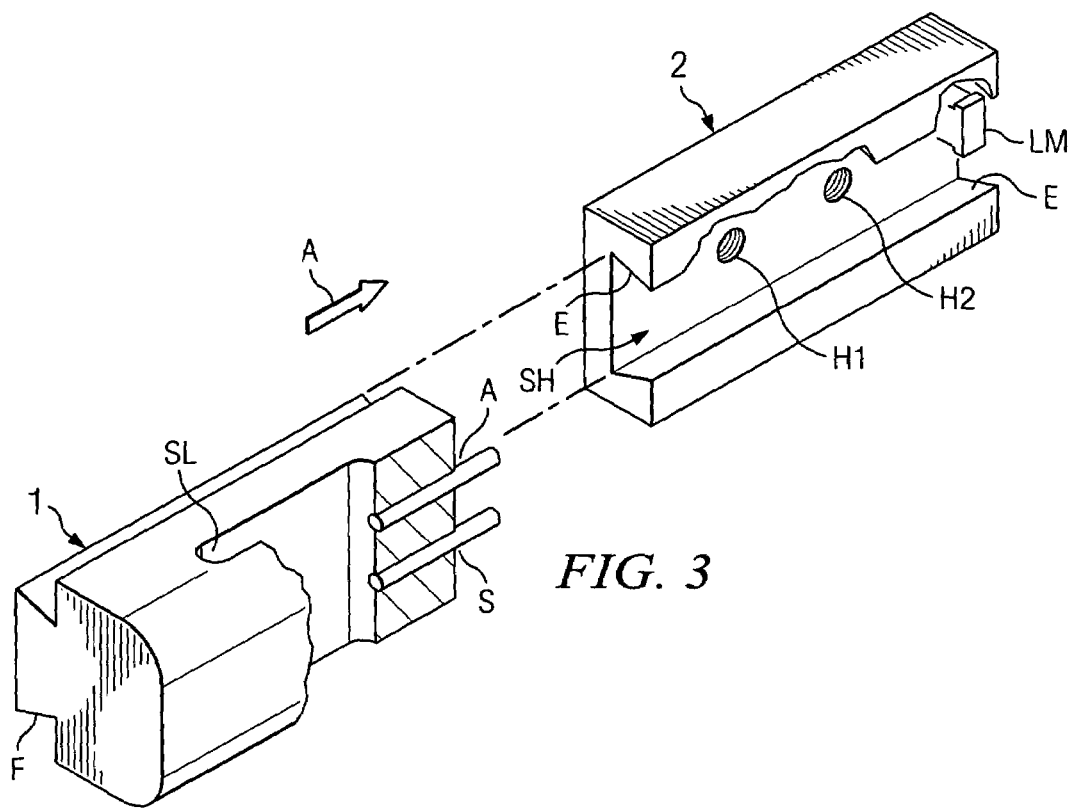
FIG. 3 is a perspective partial cutaway view illustrating how slider 1 may be inserted into fixed portion 2.

FIG. 3 is a perspective view illustrating how the slider 1 may be easily inserted into fixed portion 2. As illustrated, slider 1 may be moved longitudinally in the direction of arrow A so that its foot F slides snugly into a shoe SH defined within fixed portion 2. Shoe SH may be defined by, for example, two inwardly slanting edges E of opposite sides of the fixed portion. In this manner, shoe SH may assume the shape of a hollow regular trapezoid that mates with the regular-trapezoidal shape of the slider's foot F.

As slider 1 slides further within shoe SH of the fixed portion 2, it encounters a latch male portion LM (FIG. 3) that engages and secures the slider's latch female portion LF (FIG. 2B). In one embodiment, the latch male portion LM is a spring-loaded protrusion (spring not illustrated) that snaps into place within latch female portion LF so as to secure the slider within the shoe SH of fixed portion 2. A person may remove the slider from the fixed portion's shoe by merely finger-pressing the latch male portion LM against the force of the spring (not shown) so as to release it from the latch female portion LF, and sliding the slider out of the shoe in a direction opposite arrow A (FIG. 3).

Fixed portion 2 may be attached to base 3 (FIG. 1) by some suitable affixation means, such as screws inserted through holes H1 and H2 in shoe SH. Alternatively, fixed portion 2 and base 3 may be a single, unitary piece requiring no affixation means; in this embodiment, elements 2 and 3 constitute a single fixed portion 2/3.

During operation, wire (such as gold wire of 0.6 mils to 2.0 mils, for example) is fed from a wire source (such as a spool) to a destination (such as a capillary allowing lengths of the wire to be affixed to a semiconductor package). Elongated slot SL enables the wire to move from position W1 to position W2 (FIG. 2A), forming a curve and fluttering freely when air from air tube AT applies force to it.

Sensor wire SW is oriented parallel to the longitudinal direction of slot SL, to detect the position of the wire in the slot. When wire W is sufficiently close to sensor wire SW (which, again, may be an optical fiber), wire W blocks the light entering sensor wire SW, thus allowing the sensor (optical sensor, not illustrated) to accurately conclude that wire W is at or near position W1. Advantageously, after installation, no adjustment of air tube AT and sensor wire SW are generally required.

The operational cycle is a repetitive process. However, throughout the process, air from air tube AT applies force against the wire W urging it from position W1 toward position W2 (FIG. 2A). When the bonding of a wire segment is completed, wire W is pulled from below and tends to straighten the wire into position W1 (FIG. 2A). At this time, the sensor attached to sensor wire SW detects the movement of wire W into position W1, and causes a wire source (spool) motor to release more wire from above. As more wire is released from the spool, the length of wire slackens and allows air from air tube AT to move wire W toward position W2. The sensor attached to sensor wire SW detects the movement of the wire away from position W1, and sends a signal to stop the spool from unwinding additional wire. When the wire bonding is completed, the wire is consumed and thus pulls the wire down tautly through the slot SL to position W1, beginning the cycle anew.

The slider portion 1 may be "unitary" in nature. As understood within this specification, the term "unitary" denotes an element that, in operation, is a single piece. Though the slider may be of unitary in operation, of course the slider may be manufactured of more than one piece, to satisfy considerations such as ease of manufacture. If the slider is manufactured of plural pieces, it is understood that the plural pieces are joined together by any suitable process (glue, welding, or other affixation means) before the slider is placed in operation.

A unitary piece avoids the problems of the conventional arrangement described in the Background section, in which removal of screws allowed guide plates and shim to fall off, possibly causing damage or loss. In contrast, the present embodiment's unitary construction ensures that the slider may be easily removed for cleaning or other servicing, with minimal risk of damage or loss.

The placement of air tube hole A and sensor wire hole S within a slider 1 that is unitary in operation, ensures that no adjustments need to be made, either to the air tube AT or to the fiber optic sensor wire SW. In this manner, the slider is essentially self-adjusting (with respect to air pressure and wire position sensing), thus increasing reliability and reducing maintenance requirements.

Further, the placement of air tube hole A and sensor wire hole S in the protected body of the slider 1, with both holes leading straight to slot SL, helps to ensure that the air tube AT and sensor wire SW remain clean for an extended period of time. The enhanced cleanliness of the air tube and sensor wire enhances the overall reliability of the wire feed sensor guide, thus reducing the need for cleaning and other maintenance. Even when cleaning and maintenance is necessary, the unitary nature of the slider makes it easy for individuals without specific training or skills, and without any tools, to perform the cleaning and maintenance.

Thus, the present disclosure provides support for a wire feed sensor guide especially suitable for use in fabrication of semiconductor packages, by controllably guiding a wire from a wire source to a wire bonding location. The wire feed sensor guide has (a) a fixed portion (2 or 2/3) including a trapezoidal shoe (SH) and a first latch portion (LM); and (b) a slider (1). The slider includes (b1) a trapezoidal foot (F) shaped to slide snugly into the trapezoidal shoe (SH); (b2) a second latch portion (LF) configured to engage with the first latch portion (LM) when the slider foot (F) is slid into the fixed portion's shoe (SH) so as to secure the slider to the fixed portion, wherein the latch portions are configured to be operated without tools by a human user so as to become disengaged to allow the slider (1) to be manually removed from the fixed portion (2 or 2/3) without tools by the human user; (b3) a slot (SL) that is shaped and arranged to receive wire (W) from the wire source and to guide the wire toward the wire bonding location; (b4) an air tube hole (A) configured to transmit air from an air source into the slot (SL) so as to urge the wire (W) from a first position (W1) toward a second position (W2); and (b5) a sensor wire hole (S) oriented with respect to possible wire (W) positions (W1, W2, . . . ) so as to transmit an indication of the wire position along a sensor wire (SW) that is substantially protected from contamination by being substantially enclosed in the slider and exposed only inside the slot (SL).

The present disclosure also supports a wire feed sensor guide especially suitable for use in fabrication of semiconductor packages, by controllably guiding a wire from a wire source to a wire bonding location, the wire feed sensor guide having a unitary piece (1) configured to be manually removable without tools from a fixed portion (2 or 2/3), the unitary piece including a slot (SL) configured to guide the wire from the wire source to the wire bonding location.

The unitary piece (1) may be a slider (1) that further includes a trapezoidal foot (F) shaped to slide snugly into a trapezoidal shoe (SH) in the fixed portion.

The fixed portion (2 or 2/3) may include a first latch portion (LM); and the unitary piece (1) may further include a second latch portion (LF) configured to engage with the first latch portion (LM) when the slider foot (F) is slid into the fixed portion's shoe (SH) so as to secure the slider (1) to the fixed portion (2 or 2/3), wherein the latch portions are configured to be operated without tools by a human user so as to become disengaged to allow the slider (1) to be manually removed from the fixed portion (2 or 2/3) without tools by the human user.

The unitary piece (1) may further include a slot (SL) that is shaped and arranged to receive wire (W) from the wire source and to guide the wire toward the wire bonding location.

The unitary piece (1) may further include an air tube hole (A) configured to transmit air from an air source into the slot (SL) so as to urge the wire (W) from a first position (W1) toward a second position (W2); and a sensor wire hole (S) oriented with respect to possible wire (W) positions (W1, W2, . . . ) so as to transmit an indication of the wire position along a sensor wire (SW).

The air tube hole (A) and the sensor wire hole (S) may be substantially parallel and lead from a same end of the unitary piece (1) to a same end of the slot (SL).

The air tube hole (A) and the sensor wire hole (S) may hold an air tube (AT) and a sensor wire (SW), respectively, at respective fixed locations in the unitary piece, so as to ensure the positions of the air tube (AT) and a sensor wire (SW) are self-adjusting so as to avoid a need for manual adjustment.

The sensor wire (SW) may be substantially protected from contamination by being substantially enclosed in the slider and exposed only inside the slot (SL).

The present disclosure also provides support for a method of providing service to the above wire feed sensor guide. The method may involve manually releasing the unitary piece (1) from the fixed portion (2 or 2/3) without using tools; performing the service; and manually replacing the unitary piece (1) into the fixed portion (2 or 2/3) without using tools.

The releasing step may include manually sliding the unitary piece (1) out of the fixed portion (2 or 2/3) without using tools; and the replacing step may include manually sliding the unitary piece (1) back into the fixed portion (2 or 2/3) without using tools.

The releasing step may further include a step of, without using tools, manually releasing a latch that normally fixes the unitary piece (1) to the fixed portion (2 or 2/3).

The replacing step may further include without using tools, manually sliding the unitary piece (1) back into the fixed portion (2 or 2/3) without using tools so that a first latch portion on the fixed portion engages a second latch portion on the unitary piece.

Many alternatives, modifications, and variations will be apparent to those skilled in the art in light of the above teachings. For example, the choice of component materials, their dimensions, their interconnections, their assembly schemes, and so forth, other than those specifically disclosed herein, lies within the scope of the present invention. It is therefore to be understood that within the scope of the appended claims and their equivalents, the invention may be practiced otherwise than as specifically described herein.

What is claimed is:

1. A wire feed sensor guide especially suitable for use in fabrication of semiconductor packages, by controllably guiding a wire from a wire source to a wire bonding location, the wire feed sensor guide comprising:
   a) a fixed portion including a trapezoidal shoe and a first latch portion; and
   b) a slider including:
      b1) a trapezoidal foot shaped to slide snugly into the trapezoidal shoe;
      b2) a second latch portion configured to engage with the first latch portion when the slider foot is slid into the fixed portion's shoe so as to secure the slider to the fixed portion, wherein the latch portions are configured to be operated without tools by a human user so as to become disengaged to allow the slider to be manually removed from the fixed portion without tools by the human user;

b3) a slot that is shaped and arranged to receive wire from the wire source and to guide the wire toward the wire bonding location;

b4) an air tube hole configured to transmit air from an air source into the slot so as to urge the wire from a first position toward a second position; and b5) a sensor wire hole oriented with respect to possible wire positions so as to transmit an indication of the wire position along a sensor wire that is substantially protected from contamination by being substantially enclosed in the slider and exposed only inside the slot.

2. An wire-bonder comprising:
a wire-spool:
a wire extending from the wire soool to a capillary: and
a wire feed sensor guide disposed between the wire-spool and the capillary comprising:
a fixed portion including a trapezoidal shoe and a first latch portion:
  a unitary piece which includes:
    a trapezoidal foot shaped to slide snugly into the trapezoidal shoe;
a second latch portion conflaured to engage with the first latch portion when the foot is slid into the fixed portion's shoe to secure the unitary piece to the fixed portion.

3. The wire feed sensor guide of claim 2, wherein:
the fixed portion includes a first latch portion; and
the unitary piece further includes a second latch portion configured to engage with the first latch portion when the slider foot is slid into the fixed portion's shoe so as to secure the slider to the fixed portion, wherein the latch portions are configured to be operated without tools by a human user so as to become disengaged to allow the slider to be manually removed from the fixed portion without tools by the human user.

4. The wire feed sensor guide of claim 2, wherein the unitary piece further includes:
a slot that is shaped and arranged to receive wire from the wire source and to guide the wire toward the wire bonding location.

5. The wire feed sensor guide of claim 4, wherein the unitary piece further includes:
an air tube hole configured to transmit air from an air source into the slot so as to urge the wire from a first position toward a second position; and a sensor wire hole oriented with respect to possible wire positions so as to transmit an indication of the wire position along a sensor wire.

6. The wire feed sensor guide of claim 5, wherein:
the air tube hole and the sensor wire hole are substantially parallel and lead from a same end of the unitary piece to a same end of the slot.

7. The wire feed sensor guide of claim 5, wherein:
the air tube hole and the sensor wire hole hold an air tube and a sensor wire, respectively, at respective fixed locations in the unitary piece, so as to ensure the positions of the air tube and a sensor wire are self-adjusting so as to avoid a need for manual adjustment.

8. The wire feed sensor guide of claim 4, wherein:
the sensor wire is substantially protected from contamination by being substantially enclosed in the slider and exposed only inside the slot.

9. A method of servicing a wire feeding sensor guide; comprising:
providing a wire feed sensor guide, which comprises:
  a fixed portion including a trapezoidal shoe and a first latch portion:
  a unitary piece which includes:
    a trapezoidal foot shaped to slide snugly into the trapezoidal shoe; and
    a second latch portion enaaaed with the first latch portion with the foot slid into the fixed portion's shoe and the unitary piece is secured to the fixed portion;
releasing the unitary piece from the fixed portion manually by sliding the unitary piece out of the fixed portion without using tools;
performing the service: and manually sliding the unitary piece into the fixed portion.

10. The method of claim 9, wherein the releasing step further includes:
without using tools, manually releasing a latch that normally fixes the unitary piece to the fixed portion.

11. The method of claim 9, wherein the replacing step further includes:
without using tools, manually sliding the unitary piece back into the fixed portion without using tools so that a first latch portion on the fixed portion engages a second latch portion on the unitary piece.

12. The method of claim 9, wherein the service includes cleaning a optical sensor.

* * * * *